(12) United States Patent
Hisamatsu (10) Patent No.: US 8,330,635 B2
(45) Date of Patent: Dec. 11, 2012

(54) A/D CONVERSION CIRCUIT, SOLID-STATE IMAGE SENSOR, AND CAMERA SYSTEM

(75) Inventor: Yasuaki Hisamatsu, Kanagawa (JP)

(73) Assignee: Sony Corporation, Tokyo (JP)

( * ) Notice: Subject to any disclaimer, the term of this patent is extended or adjusted under 35 U.S.C. 154(b) by 439 days.

(21) Appl. No.: 12/678,807

(22) PCT Filed: Sep. 25, 2008

(86) PCT No.: PCT/JP2008/067253
§ 371 (c)(1),
(2), (4) Date: Mar. 18, 2010

(87) PCT Pub. No.: WO2009/041474
PCT Pub. Date: Apr. 2, 2009

(65) Prior Publication Data
US 2010/0194949 A1 Aug. 5, 2010

(30) Foreign Application Priority Data

Sep. 28, 2007 (JP) ................................ 2007-256555

(51) Int. Cl.
*H03M 1/12* (2006.01)
(52) U.S. Cl. ........ 341/155; 341/118; 341/120; 341/156; 341/164; 341/169; 348/294; 348/300; 348/302; 348/308
(58) Field of Classification Search .................. 341/118, 341/120, 155, 156, 164, 169; 348/294, 300, 348/302, 308
See application file for complete search history.

(56) References Cited

U.S. PATENT DOCUMENTS 5,887,715 A * 3/1999 Vasudeva ...................... 206/373
5,920,274 A * 7/1999 Gowda et al. ................. 341/155
7,088,279 B2 8/2006 Muramatsu et al.
(Continued)

FOREIGN PATENT DOCUMENTS

JP 2005-303648 10/2005
(Continued)

OTHER PUBLICATIONS

W. Yang et al.; An Integrated 800×600 CMOS Image System; 1999 EEE International Solid-State Circuits Conference.

*Primary Examiner* — Linh Nguyen
(74) *Attorney, Agent, or Firm* — SNR Denton US LLP (57) ABSTRACT

There are provided an A/D conversion circuit in which a counter is made to be capable of performing counting at both edges of a clock, up/down count values can be switched while the up/down count values are held, and the duty of the counting operation is difficult to be distorted even with the both-edge counting, a solid-state image sensor, and a camera system. An ADC 15A is configured as an integrating-type A/D conversion circuit using a comparator 151 and a counter 152. The counter 152 has a function of switching a count mode from an up count to a down count and from a down count to an up count while a value is held, a function of performing counting at both rising and falling edges of an input clock CK at a frequency two times as high as that of the input clock, and a function of latching the input clock CK in accordance with an output signal of the comparator 151 and setting non-inverted or inverted data of the latched data to be data of an LSB.

21 Claims, 9 Drawing Sheets

U.S. PATENT DOCUMENTS

| | | | |
|---|---|---|---|
| 7,129,883 B2 * | 10/2006 | Muramatsu et al. | 341/164 |
| 7,292,177 B2 * | 11/2007 | Muramatsu et al. | 341/164 |
| 7,315,273 B2 | 1/2008 | Muramatsu et al. | |
| 7,555,094 B2 * | 6/2009 | Shin et al. | 377/54 |
| 7,567,280 B2 * | 7/2009 | Muramatsu et al. | 348/294 |
| 7,755,686 B2 * | 7/2010 | Toyama et al. | 348/300 |
| 7,990,304 B2 * | 8/2011 | Lim et al. | 341/164 |
| 8,035,717 B2 * | 10/2011 | Hisamatsu | 348/308 |
| 2009/0167586 A1 * | 7/2009 | Shimomura et al. | 341/169 |
| 2010/0225796 A1 * | 9/2010 | Lim et al. | 348/308 |
| 2011/0025900 A1 * | 2/2011 | Kondo | 348/308 |
| 2011/0074994 A1 * | 3/2011 | Wakabayashi et al. | 348/302 |

FOREIGN PATENT DOCUMENTS

JP      2005-323331      11/2005

\* cited by examiner

FIG. 9

A/D CONVERSION CIRCUIT, SOLID-STATE IMAGE SENSOR, AND CAMERA SYSTEM

TECHNICAL FIELD

The present invention relates to an A/D conversion circuit that can be applied to parallel-column output-type CMOS image sensors or the like, a solid-state image sensor using the A/D conversion circuit, and a camera system.

BACKGROUND ART

In recent years, as solid-state image sensors taking the place of CCDs, CMOS image sensors have attracted attention.

The reason for this is that various problems including the system becoming very complex because dedicated processes are necessary in the manufacture of CCD pixels, a plurality of power-supply voltages being necessary for the operations thereof, and furthermore, a plurality of peripheral ICs needing to be combined and operated, are overcome by using CMOS image sensors.

For manufacturing CMOS image sensors, it is possible to use manufacturing processes that are the same as those used for typical CMOS-type integrated circuits, also driving using a single power source is possible, and furthermore, analog circuits and logic circuits employing CMOS processes can be made to coexist in the same chip. Therefore, CMOS image sensors have a plurality of significant merits, such as it being possible to decrease the number of peripheral ICs.

Regarding output circuits of CCDs, it is usually the case that there is one channel (ch) output using an FD amplifier having a floating diffusion layer (FD).

In contrast, for CMOS image sensors, an FD amplifier is provided for each pixel, and it is usually the case that parallel-column output-types are used in which a certain row within a pixel array is selected and the pixels are simultaneously read in the column direction.

The reason for this is that it is difficult for an FD amplifier arranged in a pixel to obtain sufficient driving performance, and therefore, the data rate needs to be decreased and parallel processing is considered to be advantageous.

Various signal output circuits for this parallel-column output-type CMOS image sensor have been proposed.

As a technique used for reading a pixel signal of a CMOS image sensor, there is a method in which signal charge serving as an optical signal, which is generated by a photoelectric conversion element, such as a photodiode, is temporarily sampled and read out, via a MOS switch arranged in the vicinity thereof, to a capacitor ahead of the MOS switch.

In a sampling circuit, usually, noise having a reverse correlation with a sampling capacitance value is carried. In a pixel, when signal charge is to be transferred to a sampling capacitor, a potential slope is used, and signal charge is completely transferred. Therefore, noise is not generated in this sampling process, but noise is carried when the voltage level of the preceding capacitor is reset to a certain reference value.

As a typical technique for removing this noise, there is correlated double sampling (CDS). This is a technique in which a state (reset level) immediately before signal charge is sampled once is read and stored, then, the signal level after sampling is read, and the signal level is subtracted, thereby removing noise.

There are various specific methods for CDS. One of most advanced forms regarding signal output circuits of parallel-column output-type CMOS image sensors is a type in which an analog-digital (A/D) conversion circuit (ADC (analog digital converter)) is provided for each column, and a pixel signal is extracted as a digital signal.

A CMOS image sensor having such a parallel column-type ADC mounted therein is disclosed in, for example, W. Yang et al. (W. Yang. et. Al., "An Integrated 800×600 CMOS Image System, "ISSCC Digest of Technical Papers, pp. 304-305, February, 1999), Japanese Unexamined Patent Application Publication No. 2005-303648, and Japanese Unexamined Patent Application Publication No. 2005-323331.

For example, in the solid-state image sensor disclosed in Japanese Unexamined Patent Application Publication No. 2005-303648, A/D conversion circuit constituted by a counter, a comparator, and a reference voltage generator is used, a reset level is A/D converted by down count, and next, the signal level is A/D converted by up-count while the value is held, thereby performing CDS by differential computation of digital data.

For this, in pixels arranged in a two-dimensional manner, signal processing circuits in which output signal lines thereof are shared in the vertical direction and in which A/D conversion circuit that receives the output signal lines are included are provided for corresponding signal lines, so that large-scale parallel processing for reading pixel signals for one row at the same time is performed, and high-speed image capturing is realized.

However, in the above-described method, a counter circuit exists in each column, and many counters perform counting operations at the time of A/D conversion, thereby presenting a problem in that the operation electrical current thereof is increased. Furthermore, in addition, in order to shorten an A/D conversion time period and perform A/D conversion of a larger number of gradations within a certain time period, it is necessary to increase the count frequency, and this also causes the operation electrical current to increase.

The present invention aims to provide an A/D conversion circuit in which a counter is made to be capable of performing counting at both edges of a clock, up/down count values can be switched while the up/down count values are held, and it is difficult for the duty of the counting operation to become distorted even with the both-edge counting, a solid-state image sensor, and a camera system.

DISCLOSURE OF INVENTION

An A/D conversion circuit according to a first aspect of the present invention includes a comparator for comparing a signal potential with a reference voltage and outputting a determination signal regarding the comparison; and a counter whose operation is controlled in accordance with an output of the comparator, wherein the counter has a function of switching a count mode from an up count to a down count and from a down count to an up count while a value is held, a function of performing counting at both rising and falling edges of an input clock at a frequency two times as high as that of an input clock, and a function of latching the input clock in accordance with an output signal of the comparator and setting non-inverted or inverted data of the latched data to be data of an LSB.

Preferably, the counter includes an LSB circuit that operates at the same frequency as the input clock and that sets an output of an operation thereof to be the LSB data of the counter, and a ripple counter in which bit circuits at the immediately subsequent and following stages of the LSB circuit, the bit circuits frequency-dividing an input signal, are cascade-connected.

Preferably, the counter has an output logic switching function unit for realizing a function of switching up/down while a count is held.

Preferably, the LSB circuit of the counter includes a latch circuit for latching an input clock, and a holding unit for separately storing and holding an output of the latch circuit, and wherein the LSB circuit of the counter has a function of switching non-inversion and inversion of an input clock of the next bit on the basis of the held data of the holding unit.

Preferably, the ripple counter includes a flip-flop, data from the previous stage being supplied to a clock terminal of the flip-flop, a first selector connected to the data output side of the flip-flop, and a second selector whose input is connected to the data output end of the flip-flop and whose output is connected to the data input end of the flip-flop.

Preferably, in the ripple counter, the switching of the first selector is controlled in accordance with an up/down control signal, and the switching of the second selector is controlled in accordance with a hold signal.

Preferably, in the ripple counter, in accordance with the control signal, the output logic of each bit is inverted, and previously up-counted data is inverted so as to be converted into complement data, thereby being switched to a down-counted result, and in order to prevent data inversion that occurs during the switching time from changing the data of the next bit, in a period in which the control signal is switched, input/output of each bit is temporarily changed from negative feedback to positive feedback, so that the data of the flip-flop is fixed.

Preferably, in the ripple counter, the level of the control signal is switched in a state in which the data of the flip-flop is fixed, the output logic is inverted, and then, the hold signal is returned to the original, thereby returning to the original count state.

Preferably, the ripple counter includes a flip-flop, data from the previous stage being supplied to a clock terminal of the flip-flop, and a circuit that is arranged at the input stage of the clock terminal of the flip-flop and that is capable of adding both the rising and falling edges that are necessary for a counting operation in response to an external signal.

Preferably, the holding unit of the LSB circuit is arranged further toward the comparator side than the input unit of the input clock and the latch circuit in a physical manner.

Preferably, in the counter, a circuit whose state is switched in accordance with the data of the LSB as a result of previous A/D conversion exists subsequently to a latch circuit that latches an input clock.

A solid-state image sensor according to a second aspect of the present invention includes pixel units in which a plurality of pixels that perform photoelectric conversion are arranged in a matrix, and a pixel signal reading unit that reads pixel signals in units of a plurality of pixels from the pixel units, wherein the pixel signal reading unit includes a plurality of A/D conversion circuits including a comparator arranged in such a manner as to correspond to column arrangement of the pixels, the comparator comparing a read signal potential with a reference voltage and outputting a determination signal regarding the comparison, and a counter whose operation is controlled in accordance with the output of the comparator, the counter counting the comparison time period of the corresponding comparator, and wherein the counter has a function of switching a count mode from an up count to a down count and from a down count to an up count while a value is held, a function of performing counting at both rising and falling edges of an input clock at a frequency two times as high as that of an input clock, and a function of latching the input clock in accordance with an output signal of the comparator and setting non-inverted or inverted data of the latched data to be data of an LSB.

A camera system according to a third aspect of the present invention includes a solid-state image sensor; and an optical system for forming a subject image in the image sensor, the solid-state image sensor includes pixel units in which a plurality of pixels that perform photoelectric conversion are arranged in a matrix; and a pixel signal reading unit that reads pixel signals in units of a plurality of pixels from the pixel units, wherein the pixel signal reading unit includes a plurality of A/D conversion circuits including a comparator arranged in such a manner as to correspond to column arrangement of the pixels, the comparator comparing a read signal potential with a reference voltage and outputting a determination signal regarding the comparison, and wherein the counter has a function of switching a count mode from an up count to a down count and from a down count to an up count while a value is held, a function of performing counting at both rising and falling edges of an input clock at a frequency two times as high as that of an input clock, and a function of latching the input clock in accordance with an output signal of the comparator and setting non-inverted or inverted data of the latched data to be data of an LSB.

According to the present invention, rather than a counter that performs counting at the frequency of an input clock, a counter that performs a counting operation at both rising and falling edges of an input clock is used. Then, in the present invention, by using a counter for both-edge counting of a clock, with which this counting operation is realized, up/down count values are switched while the up/down count values are held.

According to the present invention, there are advantages that a counter is made to be capable of performing counting at both edges of a clock and switching up/down count values while the up/down count values are held and the duty of a counting operation is difficult to be distorted even with the both-edge counting.

BEST MODES FOR CARRYING OUT THE INVENTION

Embodiments of the present invention will be described below in conjunction with the drawings.

Figure 1:
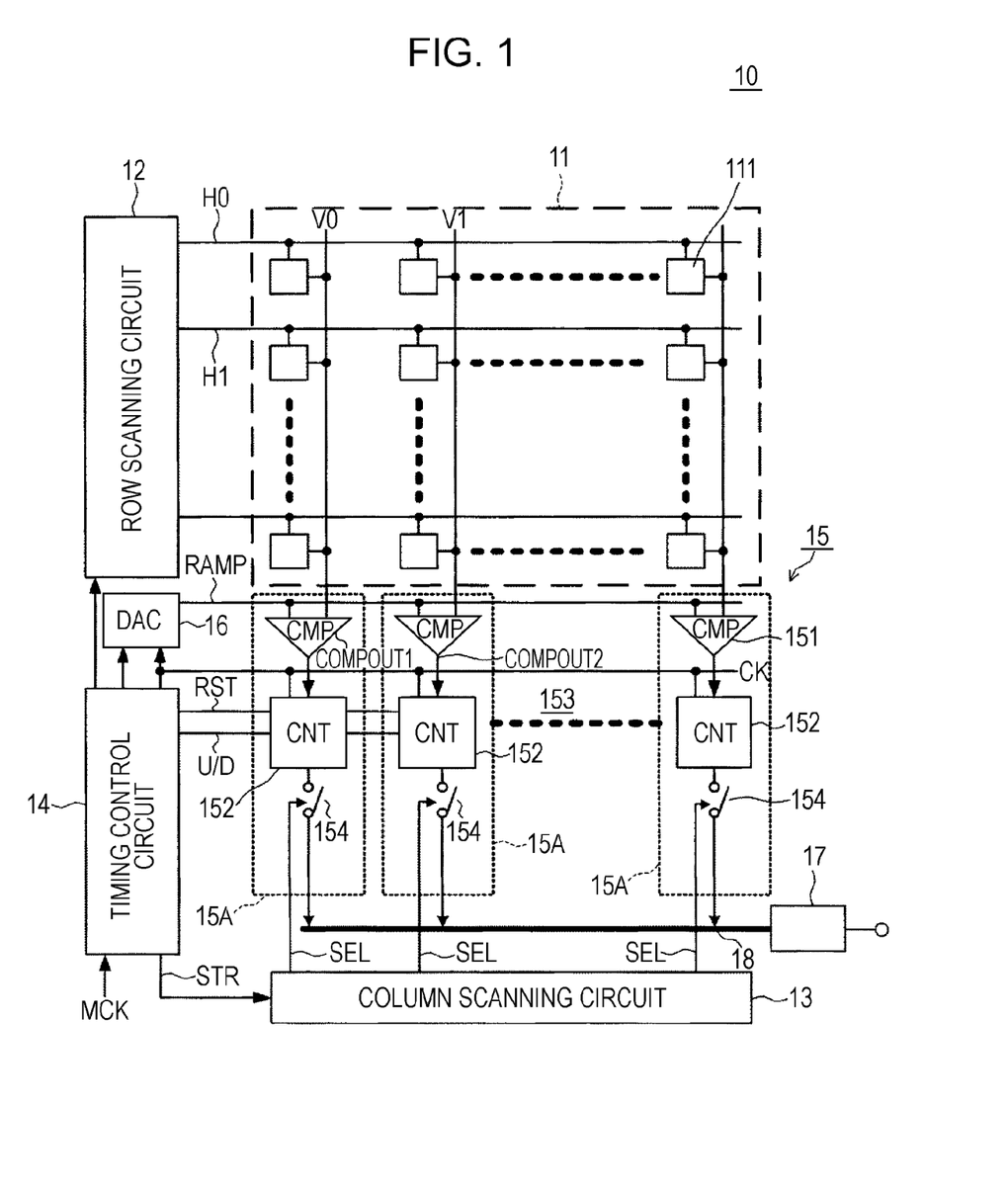
FIG. 1 is a block diagram showing an example of the configuration of a parallel column ADC-mounted solid-state image sensor (CMOS image sensor) according to an embodiment of the present invention.

FIG. 1 is a block diagram showing an example of the configuration of a parallel column ADC-mounted solid-state image sensor (CMOS image sensor) including a data transfer circuit according to an embodiment of the present invention.

Figure 2:
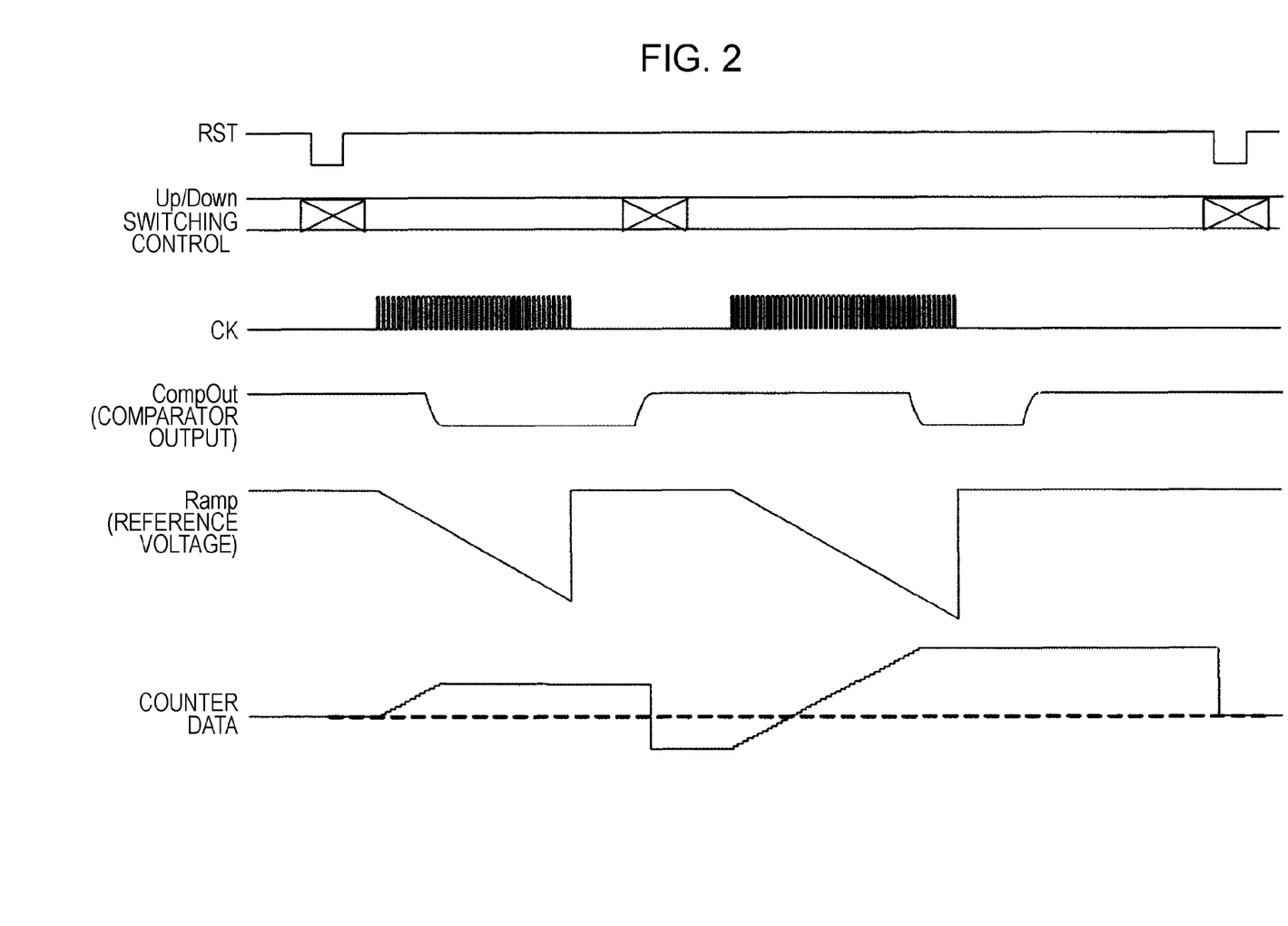
FIG. 2 shows operation waveforms of the solid-state image sensor of FIG. 1.

Furthermore, FIG. 2 shows operation waveforms of the solid-state image sensor of FIG. 1.

The solid-state image sensor 10 includes a pixel array unit 11 serving as an image-capturing unit, a row scanning circuit 12, a column scanning circuit 13, a timing control circuit 14, an ADC group 15, a digital-analog conversion circuit (hereinafter abbreviated as a "DAC (digital-analog converter)) 16 serving as a reference voltage generation circuit, and a data output circuit 17 having a sensing amplifier circuit (S/A), and the like.

The pixel array unit 11 is formed in such a manner that unit pixels 111 including a photodiode and an intra-pixel amplifier are arranged in a matrix.

Furthermore, in the solid-state image sensor 10, as control circuits for sequentially reading signals of the pixel array unit 11, the timing control circuit 14 for generating an internal clock, the row scanning circuit 12 for controlling row addressing and row scanning, and the column scanning circuit 13 for controlling column addressing and column scanning are arranged.

In the ADC group 15, an ADC (A/D conversion circuit) 15A formed of (n+1) comparators (CMPs) 151 provided in correspondence with each column of pixel arrangement that compares a ramp waveform RAMP in which a reference voltage generated by the DAC 16 is changed in a step-like manner with an analog signal obtained from the unit pixel 111 through column lines V0, V1 . . . for each of the row lines H0, H1 . . . , and up/down counters (hereinafter referred to as counters, CNT) 152 having functions of performing up counting (or down counting) upon receipt of the output of the comparator 151 and the clock CK, and holding the count value is arranged for each of the column lines V0, V1 . . . in such a manner as to correspond to each column of the pixel arrangement, thereby forming a parallel column ADC block 153.

The configuration and the functions of the counter 152 of the ADC 15A will be described later in detail.

The output of each counter 152 is connected to a data transfer line 18 via a switch 154.

In the data transfer line 18, the data output circuit 17 including a sensing circuit and a subtraction circuit, which correspond to the data transfer line 18, is arranged.

During the initial state, the counter 152 having a function as a holding circuit is, for example, in an up-count (or down-count) state. When reset counting is performed and an output COMPOUTi of the corresponding comparator 151 is inverted, the up-count operation is stopped, and the count value is held.

At this time, the initial values of the counters 152 are set to, for example, an arbitrary value of the gradations of AD conversion, for example, 0. In this reset count period, reset components ΔV of the unit pixels 111 are read.

Thereafter, the counters 152 enter a down-count (or up-count) state and perform data counting corresponding to the amount of incident light. When the output COMPOUTi of the corresponding comparator 151 is inverted, the count value corresponding to the comparison period is held.

The held counter value is scanned by the column scanning circuit 13 and is input as a digital signal to the output circuit 17 after passing through the data transfer line 18.

The column scanning circuit 13 is activated as a result of, for example, a start pulse STR and a master clock MCK being supplied, drives a corresponding selection line SEL in synchronization with a driving clock CLK in accordance with the master clock MCK (MCK is used as a reference), and causes the data transfer line 18 to read the latched data of the counter 152.

In the solid-state image sensor 10 having such a configuration, the following processing is performed in one horizontal unit period (1H).

That is, within 1H, operations are performed continuously in such a manner that first reading from the unit pixel 111 at an arbitrary row Hx to the column lines V0, V1 . . . is performed by a P-phase reading PR, a first comparison in the comparator 151 is performed by a P-phase comparison PC, a second reading is performed by a D-phase reading DR, a comparison in the comparator 151 is performed by a D-phase comparison DC, and post-processing after processing of the D-phase is performed by a D-phase post-processing DAP.

Timing control of the P-phase reading PR, the P-phase comparison PC, the D-phase reading DR, the D-phase comparison DC, and the D-phase post-processing DAP is performed by the timing control circuit 14.

Next, the specific configuration and functions of the counter 152 in the ADC (A/D conversion circuit) 15A will be described.

The ADC 15A according to the present embodiment is configured as an integrating-type A/D conversion circuit in which the comparator 151 and the asynchronous counter 152 are used.

The counter 152 has functions of capable of switching the count mode from an up count to a down count and from a down count to an up count while a value is held.

Furthermore, the counter 152 has functions of performing counting at both the rising and falling edges of the input clock CK and performing counting at a frequency two times as high as the input clock.

Then, the counter 152 has functions of asynchronously latching the input clock CK in response to an asynchronous signal of the output of the comparator 151 and setting the non-inverted or inverted data of the latched data to be LSB data.

The counter 152 has a latch circuit that latches an input clock CK, which includes an LSB bit circuit, and a memory for separately storing the output thereof, and has a function of switching the non-inversion and inversion of the input clock of the next bit on the basis of the memory data.

Furthermore, the memory is arranged in front (comparator side) of the input unit of the input clock and the latch circuit in a physical manner.

Furthermore, in the counter 152, a circuit whose state changes in accordance with the data of the LSB of the previous A/D result exists subsequently to the latch circuit that latches the input clock.

The counter 152 having such features will be described more specifically.

Figure 3:
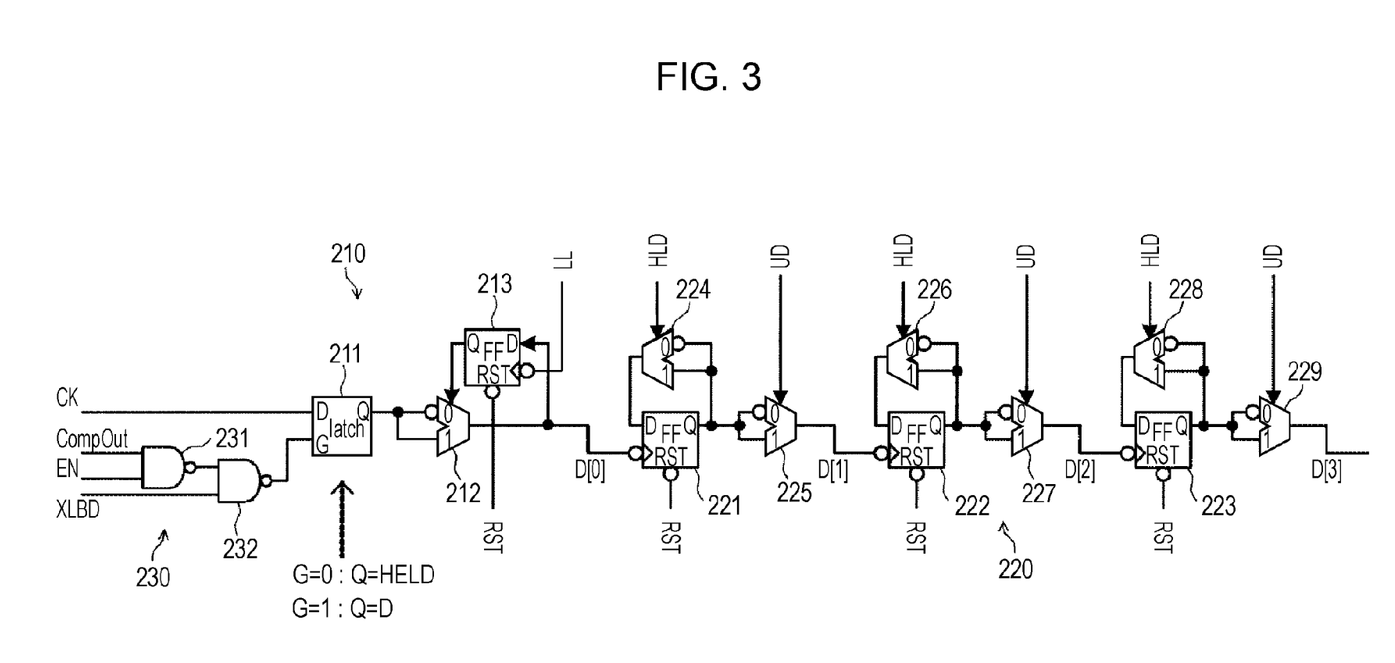
FIG. 3 is a circuit diagram showing a specific example of the configuration of an up/down asynchronous counter according to the present embodiment.

FIG. 3 is a circuit diagram showing a specific example of the configuration of an asynchronous counter, which is one mechanism of the configuration of an up/down counter according to the present embodiment.

Figure 4:
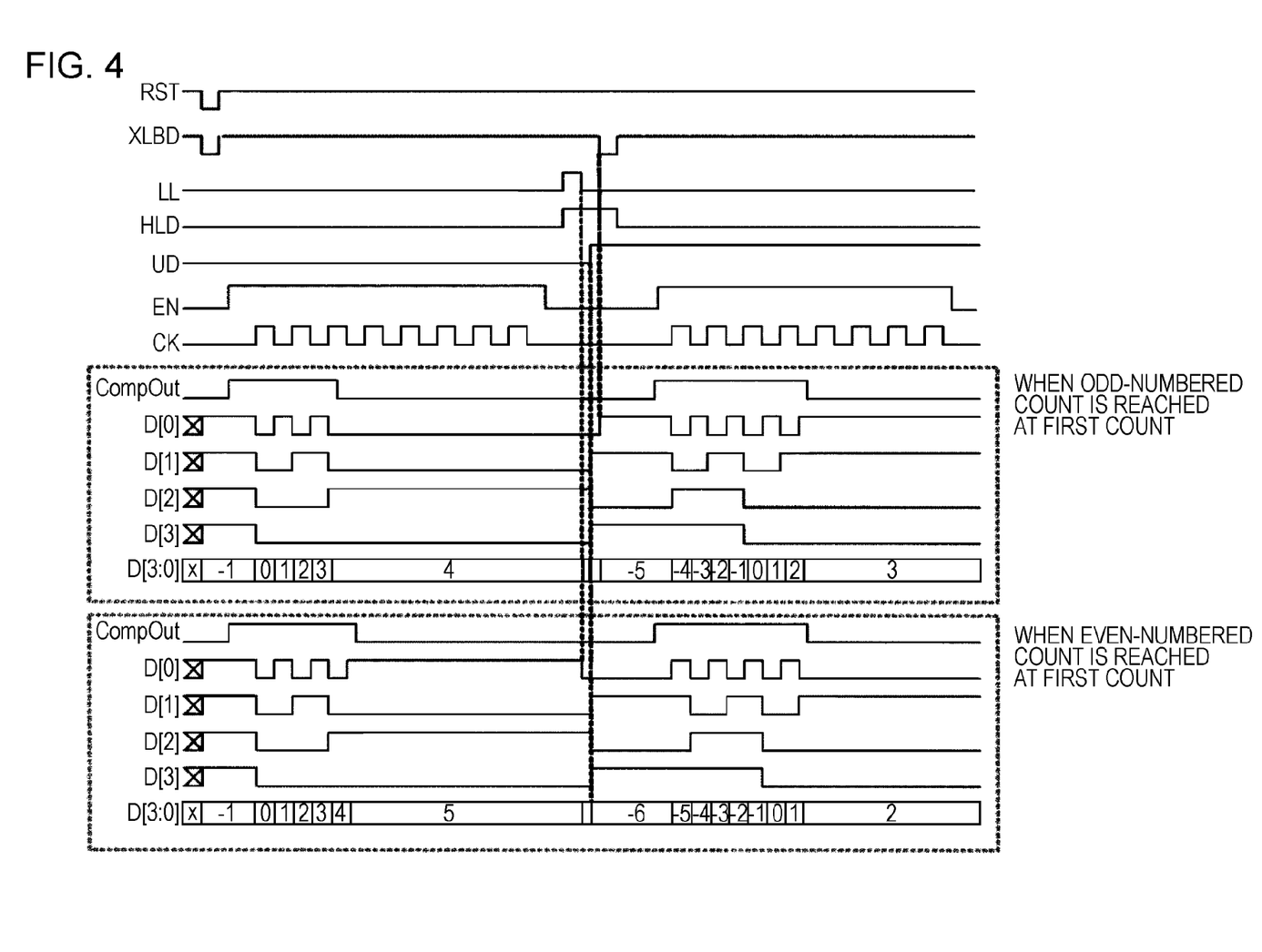
FIG. 4 is a timing chart of operations of the counter of FIG. 3.

FIG. 4 is a timing chart of operations of the counter of FIG. 3.

As shown in FIG. 3, the counter 152 is constituted by an LSB circuit 210 that operates at the same frequency as the input clock CK and that sets the output thereof to be the LSB data of the counter 152, and a so-called ripple counter 220 configured in such a manner that circuits that divide-by-two the input signal at the immediately subsequent and following stages of the LSB circuit 210 are cascade-connected.

Furthermore, the counter 152 is configured in such a form that, in addition to the LSB circuit 210 and the ripple counter 220, a logic gate part 230, such as an output logic changeover switch, for realizing a function of switching up/down while the count is held is added.

First, the configuration and operations of the ripple counter 220 other than the LSB circuit will be described.

The ripple counter 220 includes D-type FFs 221 to 223 and selectors 224 to 229.

In the ripple counter 220, the clock terminal of the negative input of the FF 221 is connected to the supply line of the output D[0] of the selector 212 of the LSB circuit 210, and the Q output is connected to the positive and negative inputs of the selectors 224 and 225. The output of the selector 224 is connected to the D input of the FF 221, and the output D[1] of the selector 225 is supplied to the negative input clock terminal of the FF 222 at the next stage.

The Q output of the FF 222 is connected to the positive and negative inputs of the selectors 226 and 227. The output of the selector 226 is connected to the D input of the FF 222, and the output D[2] of the selector 227 is supplied to the negative input clock terminal of the FF 223 at the next stage.

The Q output of the FF 223 is connected to the positive and negative inputs of the selectors 228 and 229. The output of the selector 228 is connected to the D input of the FF 223.

The output switching of the selectors 224 and 226 is selectively controlled in accordance with a hold signal HLD, and the output switching of the selectors 227 and 229 is selectively controlled in accordance with a control signal UD.

The control signal UD is used to invert the output logic of each bit, with the result that data that is up-counted previously is inverted so as to be converted into complement data, thereby being changed to a down-counted result.

In order to prevent data inversion that occurs at the time of the switching from changing the data of the next bit, during the switching period of the control signal UD, the input/output of each bit is temporarily changed from negative feedback to positive feedback in accordance with the hold signal HLD, and the data of the FFs 221 to 223 is fixed in advance.

In that state, the level of the control signal UD is switched, and output logic is inverted. Next, the hold signal HLD is returned to the original, and the state is returned to the original count state. This series of operations enables the up/down count mode to be switched while the data is held.

In this example, as a basic unit of the counter 152, an FF configured by an up counter in which data inversion occurs at a negative edge of an input clock has been described. Alternatively, it is possible to form, even using a down counter, a counter that switches up/down by a similar technique.

Next, a description will be given of the configuration and operation of the LSB circuit 210, which are the features of the present embodiment.

The LSB circuit 210 includes a latch circuit 211, a selector 212, and a D-type flip-flop (FF) 213 serving as a holding unit (memory).

The ripple counter 220 includes D-type FFs 221 to 223 and selectors 224 to 229.

Furthermore, the logic gate part 230 includes two-input NAND gates 231 and 232.

The D input of the latch circuit 211 is connected to the supply line of the clock CK, and the G input thereof is connected to the output of the logic gate part 230, and the Q output thereof is connected to the positive and negative inputs of the selector 212. The latch circuit 211 holds data when the G input is logic 0 (low level) and outputs the input data when the G input is logic 1 (high level).

The output of the selector 212, as the D input of the FF 213 and the data bit D[0], is connected to the negative clock input terminal of the FF 221 of the ripple counter 220.

The negative clock input terminal of the FF 213 is connected to the input line of the signal LL, and the Q output is connected to the switching control terminal of the selector 212.

That is, the output switching of the selector 212 is selectively controlled on the basis of the output of the FF 213.

In the logic gate part 230, one of the input terminals of the NAND gate 231 is connected to the supply line of the output signal CompOut of the comparator 151 at the previous stage, the other input terminal is connected to the supply line of the signal EN, and the output is connected to one of the input terminals of the NAND gate 232.

The other input terminal of the NAND gate 232 is connected to the supply line of the signal XLBD, and the output is connected to the G input of the latch circuit 211 of the LSB circuit 210.

In the LSB circuit 210, upon receiving the output CompOut signal of the comparator 151 at the previous stage of the counter 152, the latch circuit 211 latches the input clock CK as is.

At that time, a function of forcibly allowing the latch circuit 211 to be placed in a through state is effected in accordance with a signal XLBD. The signal EN is a control signal that causes the latch circuit 211 to be placed in a latched state by ignoring the comparator output CompOut in a case where the output of the comparator 151 enters an unstable state in a state other than the counting operation time.

Furthermore, at a subsequent stage of the latch circuit 211, a selector 212 for switching output logic and an FF 213 for storing the output signal of the selector 212 are arranged.

At the moment the comparator output CompOut is inverted, the latch circuit 211 enters a data held state from the through state of the input clock CK. Therefore, the input clock CK up to that point is counted by the counter 152.

Next, a data inversion operation is performed in the same manner as in the circuits other than the LSB circuit. This operation is realized by using a signal LL and a signal XLBD.

First, in response to the signal LL, the output data (D[0]) of the selector 212 is stored in the FF 213. In a case where the value is a logic value reverse to the counting start initial state (D[0]=Low), the state of the selector is maintained.

Next, the latch is temporarily placed in a through state in response to the signal XLBD, thereby loading a clock initial state. In consequence, the data is inverted.

Furthermore, when the output data of the selector 212 is to be stored in response to the signal LL, in a case where, at this time, the output data is the same logic as that of the counting start initial state (D[0]=High), at the same time as when the data is stored in the FF 213, the state of the selector 212 is switched, and the output data is inverted.

Next, when the latch is placed in a through state in response to the signal XLBD, since the latched data itself is made to be the same data as in the counting start initial state, there are no variations in the data.

The above control enables the operations of the LSB circuit 210 that switches output logic to be realized on the basis of the data latched in accordance with the comparator output CompOut.

The operation of the LSB circuit 210 and the operation of the ripple counter 220 that processes bits of other than the LSB circuit have been described separately. An example of the operation in a case where the operations are performed in combination is shown in FIG. 4.

During the period of the data inversion operation of the LSB circuit 210, the ripple counter 220, which is a circuit for bits of other than the LSB circuit, causes the data of the FFs 221 to 223 to be placed in a held state in accordance with the hold signal HLD. In consequence, the data inversion operation of the entire counter, including the LSB, is performed without damaging the data.

Here, the logic switching selector 212 of the LSB circuit 210 is considered to be placed in front of the latch circuit 211. Since this counter 152 is part of the A/D conversion circuit 15A and components up to the latch circuit 211 affect the characteristics of A/D conversion (more specifically, differentiation linearity of LSB data), changes in the state up to that point cause A/D conversion characteristics to be changed, which is undesirable.

Therefore, the circuit configuration that constantly operates in the same state up to the latch circuit as in the present method has a merit of facilitating maintenance of characteristics.

Figure 5:
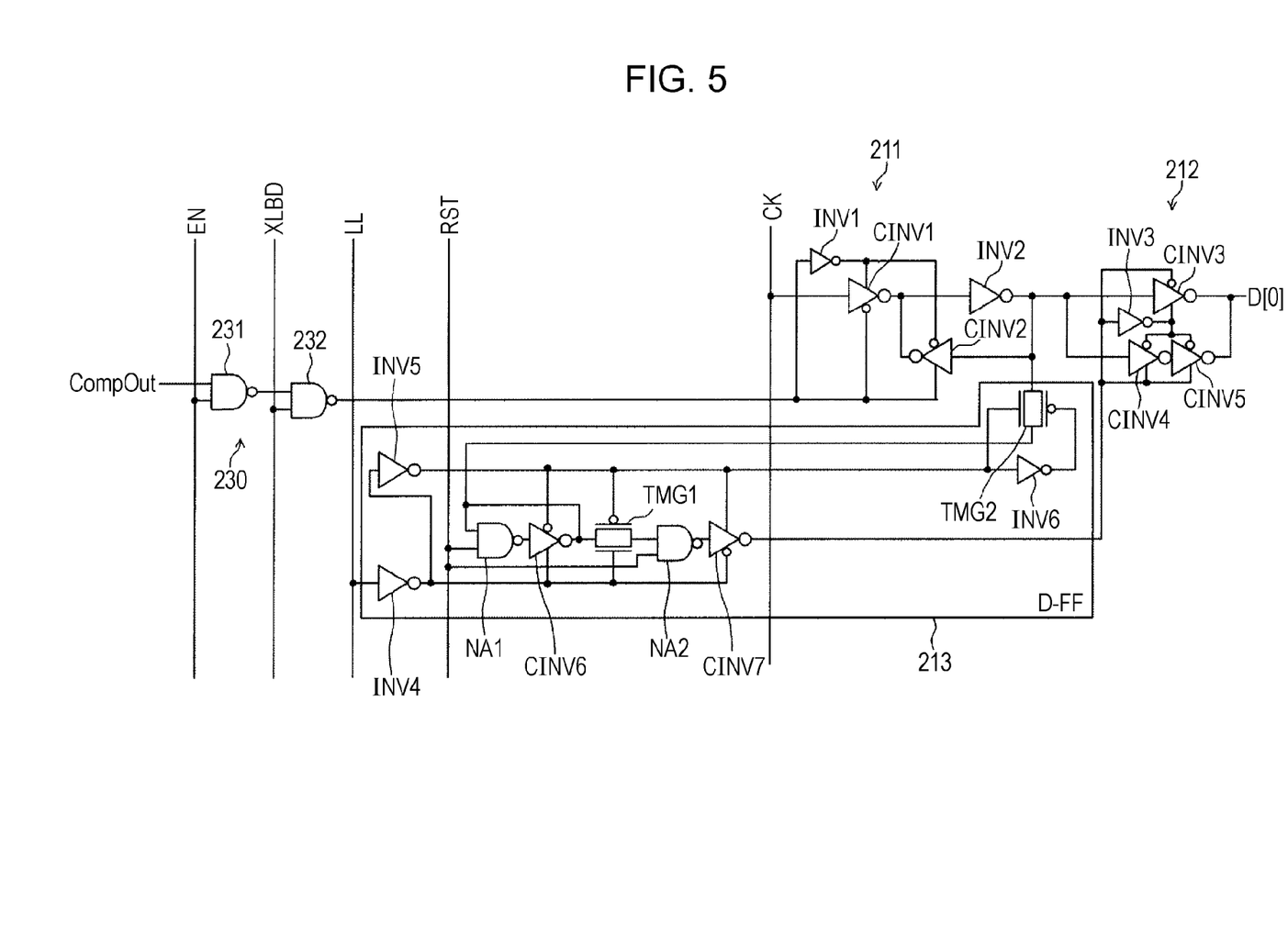
FIG. 5 is a circuit diagram showing a specific example of the configuration of an LSB circuit according to the present embodiment.

FIG. 5 is a circuit diagram showing a more specific example of the configuration of the LSB circuit according to the present embodiment.

In FIG. 5, the latch circuit 211 is constituted by clocked inverters CINV1 and CINV2, and inverters INV1 and INV2.

In the latch circuit 211, the input terminal of the clocked inverter CINV1 is connected to the supply line of the clock CK, and the output thereof is connected to the input terminal of the inverter INV2.

The input T terminal of the inverter INV1, the negative-side control terminal of the clocked inverter CINV1, and the positive-side control terminal of the clocked inverter CINV2 are connected to the output terminals of the logic gate part 230 and the NAND gate 232.

The output terminal of the inverter INV1 is connected to the positive-side control terminal of the clocked inverter CINV1 and the negative-side control terminal of the clocked inverter CINV2.

The output terminal of the inverter INV2 is connected to the input terminal of the clocked inverter CINV2 and the input terminal of the selector 212.

Then, the output of the clocked inverter CINV2 is connected to the input terminal side of the inverter INV2.

The selector 212 is constituted by clocked inverters CINV3, CINV4, and CINV5, and an inverter INV3.

In the selector 212, the input terminals of the clocked inverters CINV3 and CINV4 are connected to the output terminal of the inverter INV2 of the latch circuit 211.

The input terminal of the inverter INV3, the negative-side control terminal of the clocked inverter CINV3, and the positive-side control terminals of the clocked inverters CINV4 and CINV5 are connected to the output terminal of the FF 213.

The output terminal of the inverter INV3 is connected to the positive-side control terminal of the clocked inverter CINV3 and the negative-side control terminals of the clocked inverters CINV4 and CINV5.

Then, the output terminal of the clocked inverter CINV4 is connected to the input terminal of the clocked inverter CINV5, and the output terminals of the clocked inverters CINV3 and CINV5 are connected to each other.

The FF 213 is constituted by clocked inverters CINV6 and CINV7, inverters INV4 to INV6, NAND gates NA1 and NA2, and transfer gates TMG1 and TMG2 in which the sources and the drains of a p-channel MOS (PMOS) transistor and an re-channel MOS (NMOS) transistor are connected.

In the FF 213, the input terminal of the inverter INV4 is connected to the supply line of the signal LL, and one of the input terminals of the NAND gate NA1 and one of the input terminals of the NAND gate NA2 are connected to the supply line of a reset signal RST. The output terminal of the inverter INV4 is connected to the input terminal of the inverter INV5, the positive-side control terminal of the clocked inverter CINV6, the negative-side control terminal of the clocked inverter CINV7, and the NMOS transistor of the transfer gate TMG1.

The output terminal of the inverter INV5 is connected to the input terminal of the inverter INV6, the negative-side control terminal of the clocked inverter CINV6, the positive-side control terminal of the clocked inverter CINV7, the gate of the PMOS transistor of the transfer gate TMG1, and the gate of the NMOS transistor of the transfer gate TMG2.

The other input terminal of the NAND gate NA1 is connected to one of the input/output terminals of the transfer gate TMG2, and the output terminal is connected to the input terminal of the clocked inverter CINV6. The output terminal of the clocked inverter CINV6 is connected to one of the input/output terminals of the transfer gate TMG1, and the other input/output terminal of the transfer gate TMG1 is connected to the other input terminal of the NAND gate NA2. The output terminal of the NAND gate NA2 is connected to the input terminal of the clocked inverter CINV7, and the output terminal of the clocked inverter CINV7 is connected to the input terminal of the selector 212.

The output terminal of the inverter INV6 is connected to the gate of the PMOS transistor of the transfer gate TMG2, and the other input/output terminal of the transfer gate TMG2 is connected to the output side of the inverter INV2 of the latch circuit 211.

In the LSB circuit 210 having the above configuration, the selector 212 is configured with a switched circuit for switching a first stage and a second stage of a clocked inverter.

As a result, in a case where the state of the selector 212 is switched, the load that appears in the output unit of the latch circuit 211 hardly changes. As a result, portions for which attention needs to be paid to maintain the linearity of the LSB output data in the present circuit are limited to the output duty and the latch control signal of the latch circuit 211 if a case in which the duty of the input clock CK is distorted is not considered.

Furthermore, the circuit diagram of FIG. 5 also schematically shows the circuit arrangement configuration as a layout.

As shown in FIG. 5, the FF 213 for storing data of the selector 212 is arranged at a stage preceding the input unit of the input clock CK. In consequence, it is possible to reduce the length of wiring through which a high-speed operation is performed, thereby reducing consumption of electrical current and improving a high-speed operation margin.

As a matter to be concerned about in a case where the input clock CK is to be asynchronously latched, even when the input voltage at the moment the input clock CK is latched is an intermediate voltage, because the latch circuit 211 is formed by positive feedback using an inversion amplifier of a two-stage inverter, the input voltage settles to one of the voltage states in a short period.

It is uncertain where the input voltage will settle. From the start, this means that the analog amount is in an intermediate state of the LSB data after A/D conversion, and it may be said that this is an essential operation of A/D conversion.

In a specific example given in the present example, the realization of a counter circuit capable of performing a counting operation at both edges of an input clock and switching the up/down mode while data is held is shown. Furthermore, the counter circuit is a circuit in which the linearity of A/D is considered.

In this example, in the ripple counter 220, a circuit is used as an example in which counter bits of other than the LSB circuit are made up of selectors 225, 227, and 229 that invert the output, and selectors 224, 226, and 228 that perform positive feedback on data in order to fix the data.

This is an example of an asynchronous counter capable of inverting, when an input clock is inverted, all the data thereof, and can be applied to a circuit capable of realizing this example.

Figure 6:
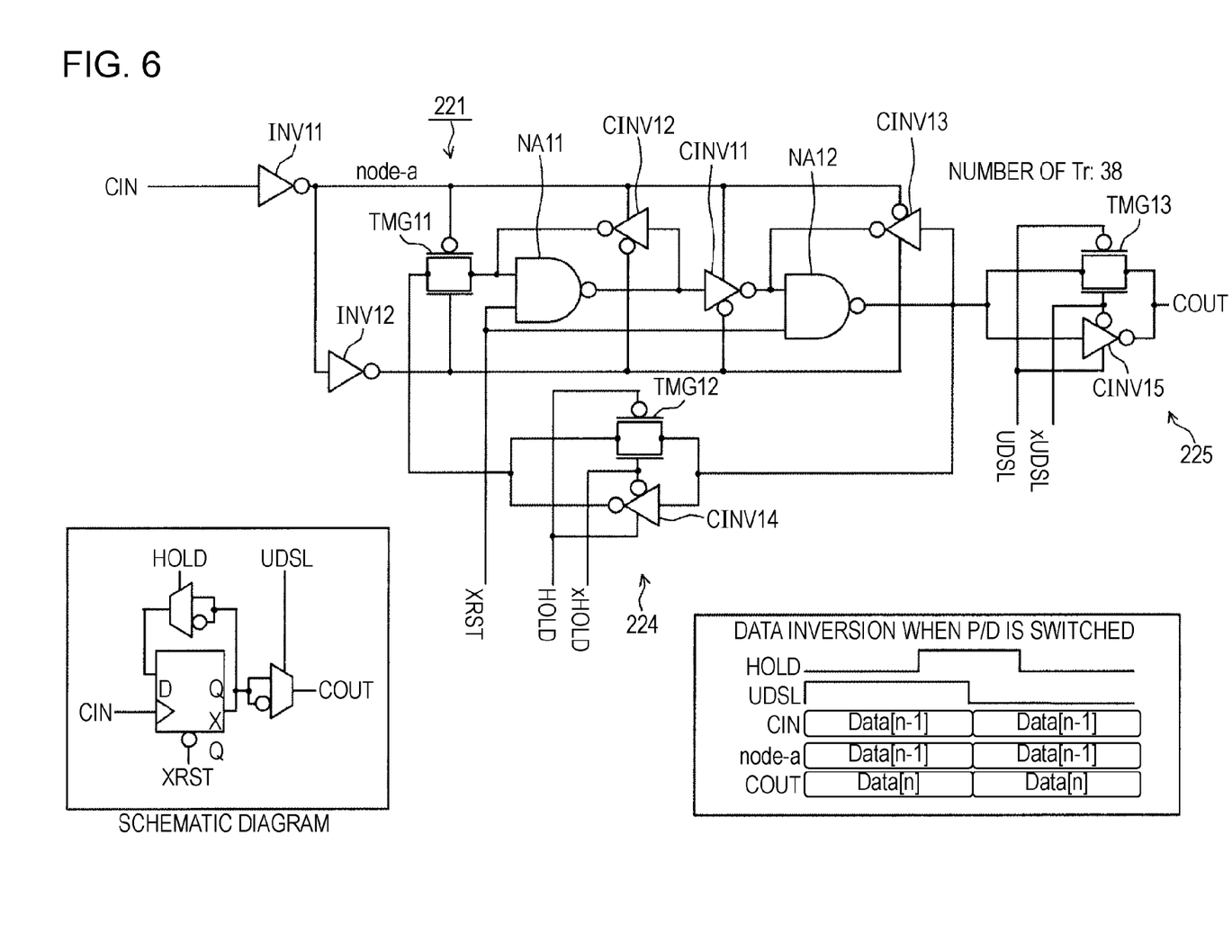
FIG. 6 is a circuit diagram showing a specific example of the configuration of a bit circuit in a ripple counter according to the present embodiment.

FIG. 6 is a circuit diagram showing a specific example of the configuration of a bit circuit in a ripple counter according to the present embodiment.

The FF 221 (222, 223) is constituted by clocked inverters CINV11, CINV12, and CINV13, inverters INV11 and INV12, two-input NAND gates NA11 and NA12, and a transfer gate TMG11.

The input terminal of the inverter INV11 is connected to the supply line of the output data CIN of the LSB circuit, and one of the input terminals of the NAND gate NA11 and one of the input terminals of the NAND gate NA12 are connected to the supply line of the inversion reset signal XRST.

The output terminal of the inverter INV11 is connected to the input terminal of the inverter INV12, the positive-side control terminal of the clocked inverters CINV11 and CINV12, the negative-side control terminal of the clocked inverter CINV13, and the gate of the PMOS transistor of the transfer gate TMG11.

The output terminal of the inverter INV12 is connected to the negative-side control terminal of the clocked inverters CINV11 and CINV12, the positive-side control terminal of the clocked inverter CINV13, and the gate of the NMOS transistor of the transfer gate TMG11.

One of the input/output terminals of the transfer gate TMG11 is connected to the output side of the selector 224 (226, 228), and the other input/output terminal is connected to the other input terminal of the NAND gate NA11. The output terminal of the NAND gate NA11 is connected to the input terminal of the clocked inverter CINV11, and the output terminal of the clocked inverter CINV11 is connected to the other input terminal of the NAND gate NA12. The output of the NAND gate NA12 is connected to the input side of the selectors 224 and 225 and the input terminal of the clocked inverter CINV13.

The output terminal of the clocked inverter CINV13 is connected to the other input terminal side of the NAND gate NA12.

The input terminal of the clocked inverter CINV12 is connected to the output side of the NAND gate NA11, and the output terminal is connected to the other input terminal side of the NAND gate NA11.

The selector 224 (226, 228) is constituted by a clocked inverter CINV14 and a transfer gate TMG12.

One of the input/output terminals of the transfer gate TMG12 and the input terminal of the clocked inverter CINV14 are connected to the output side of the FF 221.

The other input/output terminal of the transfer gate TMG12 and the output terminal of the clocked inverter CINV14 are connected to one of the input/output terminals of the transfer gate TMG11 of the FF 221.

The gate of the PMOS transistor of the transfer gate TMG12 and the positive-side control terminal of the clocked inverter CINV14 are connected to the supply line of the hold signal HOLD, and the gate of the NMOS transistor of the transfer gate TMG12 and the negative-side control terminal of the clocked inverter CINV14 are connected to the supply line of an inversion signal XHOLD of the hold signal HOLD.

The selector 225 (227, 229) is constituted by a clocked inverter CINV15 and a transfer gate TMG13.

One of the input/output terminals of the transfer gate TMG13 and the input terminal of the clocked inverter CINV15 are connected to the output side of the FF 221.

The other input/output terminal of the transfer gate TMG13 is connected to the output terminal of the clocked inverter CINV15.

The gate of the PMOS transistor of the transfer gate TMG13 and the positive-side control terminal of the clocked inverter CINV15 are connected to the supply line of the control signal UD, and the gate of the NMOS transistor of the transfer gate TMG13 and the negative-side control terminal of the clocked inverter CINV15 are connected to the supply line of the inversion signal XUD of the control signal UD.

In the bit circuit having such a configuration, as described above, the input/output in the FF 221 is temporarily subjected to positive feedback in response to the hold signal HOLD, thereby blocking a counting operation (data inversion) of the next FF at the output COUT inversion in response to the up/down control signal UD.

As described above, an example has been described in which two selectors are provided as the bit circuits of the ripple counter 220. The construction can also be formed in such a manner that the clock line of each bit is directly controlled from the outside without using two selectors.

Figure 7:
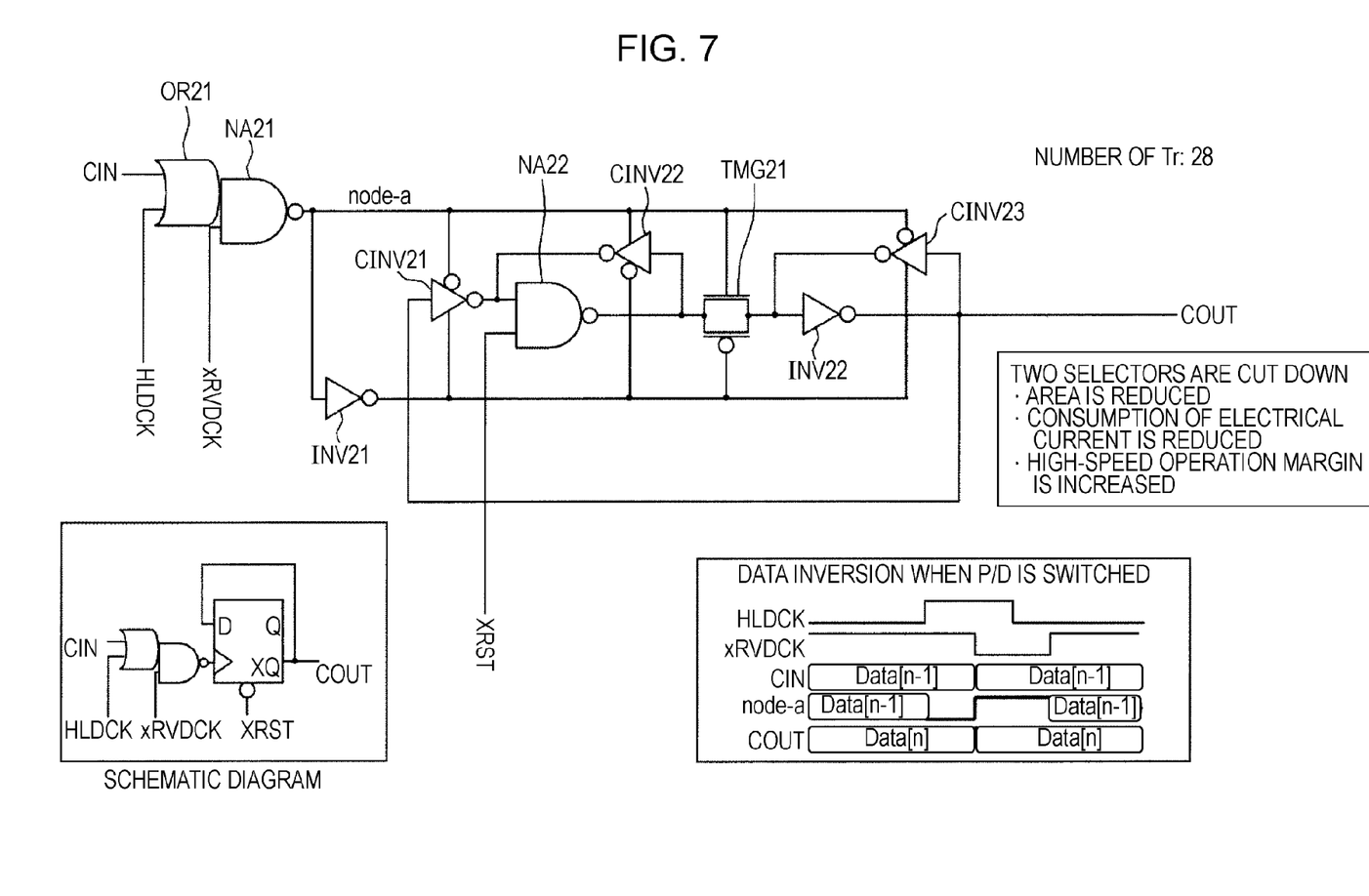
FIG. 7 is a circuit diagram showing another specific example of the configuration of a bit circuit in a ripple counter according to the present embodiment.

FIG. 7 is a circuit diagram showing another specific example of the configuration of a bit circuit in the ripple counter according to the present embodiment.

In this bit circuit, a two-input OR gate OR21 and a two-input NAND gate NA21 are arranged at the input stage of the FF 221 (222, 223).

One of the input terminals of the OR gate OR21 is connected to the supply line of the output data CIN of the LSB circuit, and the other input terminal is connected to the supply line of a signal HLDCK.

One of the input terminals of the NAND gate NA21 is connected to the output terminal of the OR gate OR21, the other input terminal is connected to the supply line of the signal XRVDCK, and the output is connected to the clock input terminal of the FF 221 (222, 223).

In this case, the FF 221 (222, 223) is constituted by clocked inverters CINV21, CINV22, and CINV23, inverters INV21, INV22, a two-input NAND gate NA22, and a transfer gate TMG21.

One of the input terminals of the NAND gate NA22 is connected to the supply line of the inversion reset signal XRST.

The input terminal of the inverter INV21, the negative-side control terminal of the clocked inverters CINV21 and CINV23, the positive-side control terminal of the clocked inverter CINV22, and the gate of the NMOS transistor of the transfer gate TMG21 are connected to the output terminal of the NAND gate NA21.

The output terminal of the inverter INV21 is connected to the positive-side control terminals of the clocked inverters CINV21 and CINV23, the negative-side control terminal of the clocked inverter CINV22, and the gate of the PMOS transistor of the transfer gate TMG21.

The input terminals of the clocked inverters CINV21 and CINV23 are connected to the output terminal of the inverter INV22.

The output terminal of the clocked inverter CINV21 is connected to the other input terminal of the NAND gate NA22. The output terminal of the NAND gate NA22 is connected to one of the input/output terminals of the transfer gate TMG21 and the input terminal of the clocked inverter CINV22.

The other input/output terminal of the transfer gate TMG21 is connected to the input terminal of the inverter INV22.

Then, the output terminal of the clocked inverter CINV23 is connected to the input terminal side of the inverter INV22.

The input terminal of the clocked inverter CINV22 is connected to the output side of the NAND gate NA22, and the output terminal is connected to the other input terminal side of the NAND gate NA22.

In this bit circuit, by directly controlling the clock line of each bit from the outside and by forcibly attaching a rising edge and a falling edge that are necessary for a counting operation (data inversion) only once, the data inversion of all the bits is realized.

Figure 8:
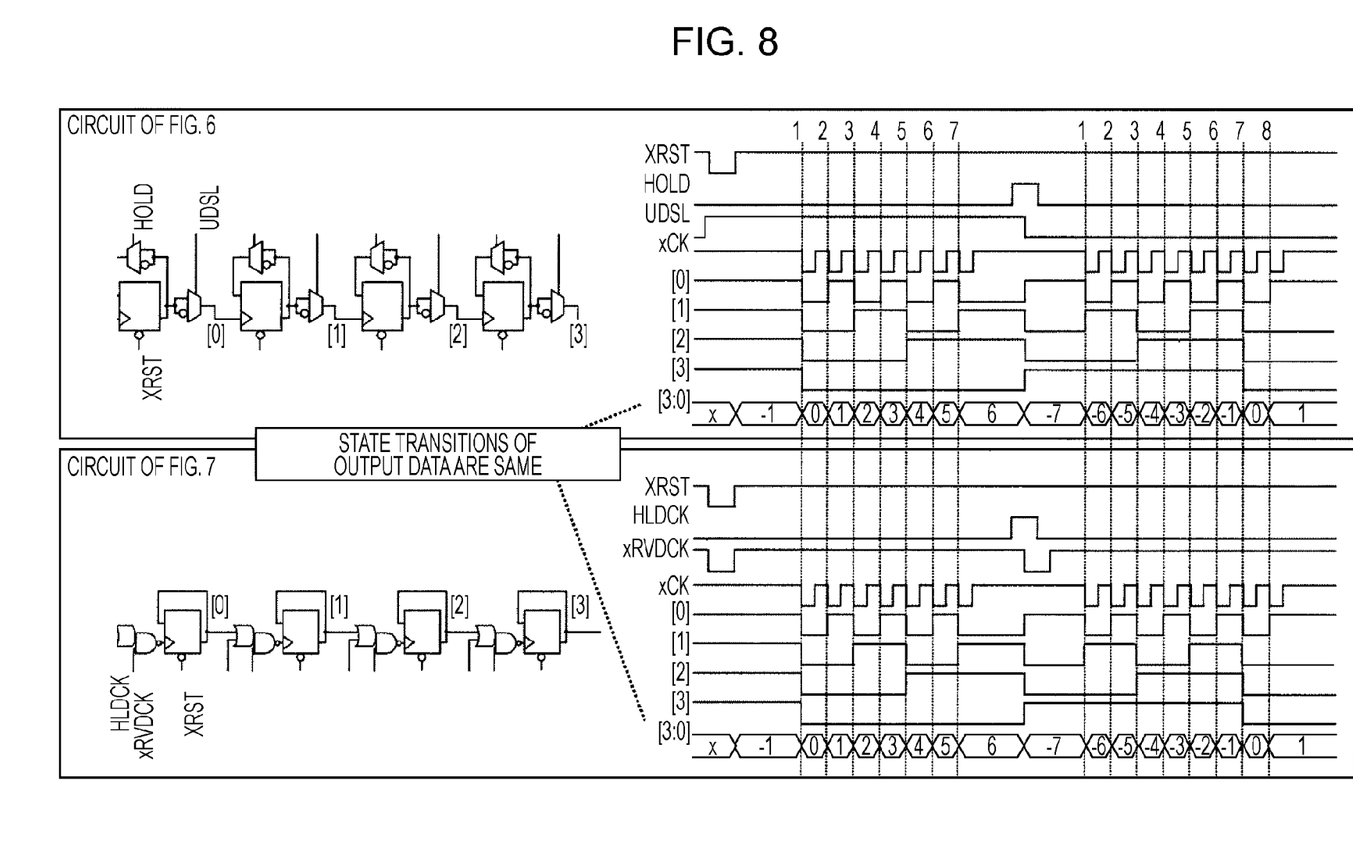
FIG. 8 shows correspondence between timing charts of the bit circuits of FIG. 6 and FIG. 7.

FIG. 8 shows the timing charts of the bit circuits of FIG. 6 and FIG. 7 in such a manner as to be associated with each other.

As shown in FIG. 8, the state transitions of the output data of the bit circuits of FIGS. 6 and 7 are the same.

However, the circuit scale of the bit circuit of FIG. 6 differs from that of the bit circuit of FIG. 7.

The bit circuit of FIG. 6 can be configured using 38 transistors, whereas the bit circuit of FIG. 7 can be configured using 28 transistors.

That is, when compared to the bit circuit of FIG. 6, the bit circuit of FIG. 7 has advantages that the circuit area can be reduced and the consumption of power can be reduced, and the high-speed operation margin is expanded.

As described above, in the present embodiment, the A/D conversion circuit using a counter capable of shifting from an up count to a down count or from a down count to an up-count mode while data is being held becomes possible to perform a counting operation at both edges of an input clock.

Furthermore, it is possible to suppress A/D conversion characteristics of the LSB data from becoming worsened for a circuit.

Here, the operation of the solid-state image sensor (CMOS image sensor) 10 will be described.

After the first reading from the unit pixel 111 at an arbitrary row Hx to the column lines V0, V1 . . . is stabilized, the DAC 16 inputs, to the comparator 151, a stepped ramp waveform PAMP in which the reference voltage is changed over time, and a comparison with the voltage of an arbitrary column line Vx is performed by the comparator 151.

In parallel with the stepped wave input of the ramp waveform RAMP, the counter 152 performs a first count.

Here, when the RAMP become equal to the voltage of Vx, the output of the comparator 151 is inverted. As a result, the counting operation of the counter 152 is stopped, and the count value corresponding to the comparison period is held.

At the time of this first reading, reset components $\Delta V$ of the unit pixel 111 are read. In the reset components $\Delta V$, noise that is varied for each unit pixel 111 is contained as an offset.

However, since variations in these reset components $\Delta V$ are generally small, and also the reset level is common among all the pixels, the output of an arbitrary column line Vx is roughly known.

Therefore, at the time of the first reading of reset components $\Delta V$, it is possible to shorten the comparison period by adjusting the ramp waveform (RAMP) voltage. In this case, for example, the comparison of $\Delta V$ is performed in the counting period (128 clocks) for 7 bits.

For a second reading, in addition to the reset components $\Delta V$, signal components corresponding to the amount of incident light for each unit pixel 111 are read, and the same operation as the first reading is performed.

That is, after the second reading from the unit pixel 111 at an arbitrary row Hx to the column lines V0, V1 . . . is stabilized, the DAC 16 inputs, to the comparator 151, a stepped wave ramp waveform RAMP in which the reference voltage is changed over time, and the comparator 151 compares the RAMP with the voltage of an arbitrary column line Vx.

In parallel with the stepped wave input of the ramp waveform RAMP, the counter 152 performs a second count.

Here, when the RAMP becomes equal to the voltage of Vx, the output of the comparator 151 is inverted, and at the same time, the count value corresponding to the comparison period is held.

At this time, the count value is held at different places between the first count and the second count.

After the end of the above AD conversion period, the column scanning circuit 13 causes first and second n-bit digital signals that are held to be detected by the data output circuit 17 after passing through the data transfer line 18. (Second signal)−(first signal) is performed in sequence by the subtraction circuit, and then the signal is output to the outside. Thereafter, the same operation is repeated for each row in sequence, and a two-dimensional image is generated.

The above operations are performed within one horizontal unit period (1H).

Then, each operation is continuously performed in such a manner that, within 1H, a first reading from the unit pixel 111 of an arbitrary row Hx to the column lines V0, V1 . . . is performed by a P-phase reading PR, a first comparison in the comparator 151 is performed by a P-phase comparison PC, a second reading is performed by a D-phase reading DR, a comparison in the comparator 151 is performed by a D-phase comparison DC, and post-processing after the process of the D phase is performed by a D-phase post-processing DAP.

As has been described above, according to the present embodiment, the ADC 15A is configured as an integrating-type A/D conversion circuit using the comparator 151 and the counter 152. The counter 152 has a function of capable of switching from an up count to a down count or from a down count to an up count while a value is held, a function of performing counting at a frequency twice that of the input clock, at which counting is performed at both the rising and falling edges of the input clock CK, and a function of asynchronously latching the input clock CK in response to an asynchronous signal of the output of the comparator 151 and setting the non-inverted or inverted data of the latched data to be the LSB data. Furthermore, an A/D conversion circuit can be realized in which it is possible to allow the counter to perform counting at both edges of a clock and to allow an up/down count value to be switched while the up/down count value is held, and the duty of the counting operation is difficult to be distorted even with the both-edge counting.

A solid-state image sensor having such advantages can be applied as an image-capturing device of a digital camera and a video camera.

Figure 9:
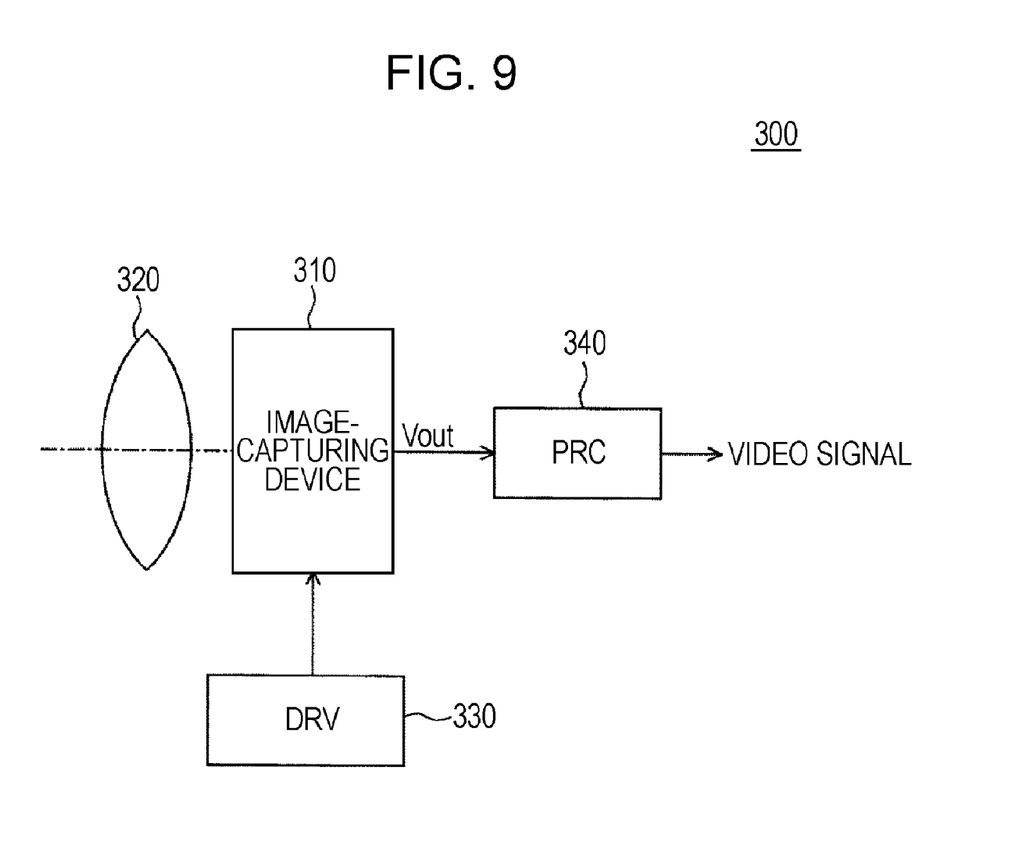
FIG. 9 shows an example of the configuration of a camera system to which a solid-state image sensor according to an embodiment of the present invention is applied.

FIG. 9 shows an example of the configuration of a camera system to which a solid-state image sensor according to an embodiment of the present invention is applied.

As shown in FIG. 9, the present camera system 300 includes an image-capturing device 310 to which the solid-state image sensor 10 according to the present embodiment can be applied, an optical system that guides incident light to a pixel area of the image-capturing device 310 (subject image is formed), for example, a lens 320 that forms incident light (image light) into an image on the imaging plane, a driving circuit (DRV) 330 for driving the image-capturing device 310, and a signal processing circuit (PRC) 340 for processing an output signal of the image-capturing device 310.

The driving circuit 330 has a timing generator (not shown) for generating various kinds of timing signals including a start pulse and a clock pulse with which circuits in the image-capturing device 310 are driven, and drives the image-capturing device 310 in accordance with a predetermined timing signal.

Furthermore, the signal processing circuit 340 performs signal processing, such as correlated double sampling (CDS), on the output signal of the image-capturing device 310.

The image signal processed by the signal processing circuit 340 is recorded on, for example, a recording medium, such as a memory. The image information recorded on a recording medium is printed in hard copy form by using a printer or the like. Furthermore, the image signal processed by the signal processing circuit 340 is displayed as a moving image on a monitor formed of a liquid-crystal display or the like.

As described above, by mounting the image sensor 10 described above as the image-capturing device 310 in an image-capturing apparatus, such as a digital still camera, a high-accuracy camera can be realized.

The invention claimed is:

1. An A/D conversion circuit comprising:
   a comparator for comparing a signal potential with a reference voltage and outputting a determination signal regarding the comparison; and
   a counter whose operation is controlled in accordance with an output of the comparator,
   wherein the counter has
      a function of switching a count mode from an up count to a down count and from a down count to an up count while a value is held,
      a function of performing counting at both rising and falling edges of an input clock at a frequency two times as high as that of an input clock, and
      a function of latching the input clock in accordance with an output signal of the comparator and setting non-inverted or inverted data of the latched data to be data of an LSB.

2. The A/D conversion circuit according to claim 1, wherein the counter includes
   an LSB circuit that operates at the same frequency as the input clock and that sets an output of an operation thereof to be the LSB data of the counter, and
   a ripple counter in which bit circuits at the immediately subsequent and following stages of the LSB circuit, the bit circuits frequency-dividing an input signal, are cascade-connected.

3. The A/D conversion circuit according to claim 1, wherein the counter has
   an output logic switching function unit for realizing a function of switching up/down while a count is held.

4. The A/D conversion circuit according to claim 2, wherein the LSB circuit of the counter includes
   a latch circuit for latching an input clock, and
   a holding unit for separately storing and holding an output of the latch circuit, and
   wherein the LSB circuit of the counter has a function of switching non-inversion and inversion of an input clock of the next bit on the basis of the held data of the holding unit.

5. The A/D conversion circuit according to claim 2, wherein the ripple counter includes
   a flip-flop, data from the previous stage being supplied to a clock terminal of the flip-flop,
   a first selector connected to the data output side of the flip-flop, and
   a second selector whose input is connected to the data output end of the flip-flop and whose output is connected to the data input end of the flip-flop.

6. The A/D conversion circuit according to claim 5, wherein, in the ripple counter,
   the switching of the first selector is controlled in accordance with an up/down control signal, and
   the switching of the second selector is controlled in accordance with a hold signal.

7. The A/D conversion circuit according to claim 6, wherein, in the ripple counter,
   in accordance with the control signal, the output logic of each bit is inverted, and previously up-counted data is inverted so as to be converted into complement data, thereby being switched to a down-counted result, and
   in order to prevent data inversion that occurs during the switching time from changing the data of the next bit, in a period in which the control signal is switched, input/output of each bit is temporarily changed from negative feedback to positive feedback, so that the data of the flip-flop is fixed.

8. The A/D conversion circuit according to claim 7, wherein, in the ripple counter,
   the level of the control signal is switched in a state in which the data of the flip-flop is fixed, the output logic is inverted, and then, the hold signal is returned to the original, thereby returning to the original count state.

9. The A/D conversion circuit according to claim 2, wherein the ripple counter includes
   a flip-flop, data from the previous stage being supplied to a clock terminal of the flip-flop, and
   a circuit that is arranged at the input stage of the clock terminal of the flip-flop and that is capable of adding both the rising and falling edges that are necessary for a counting operation in response to an external signal.

10. The A/D conversion circuit according to claim 4, wherein the holding unit of the LSB circuit is arranged further toward the comparator side than the input unit of the input clock and the latch circuit in a physical manner.

11. The A/D conversion circuit according to claim 2, wherein, in the counter, a circuit whose state is switched in accordance with the data of the LSB as a result of previous A/D conversion exists subsequently to a latch circuit that latches an input clock.

12. A solid-state image sensor comprising:
   pixel units in which a plurality of pixels that perform photoelectric conversion are arranged in a matrix; and
   a pixel signal reading unit that reads pixel signals in units of a plurality of pixels from the pixel units,
   wherein the pixel signal reading unit includes
      a plurality of A/D conversion circuits including
         a comparator arranged in such a manner as to correspond to column arrangement of the pixels, the comparator comparing a read signal potential with a reference voltage and outputting a determination signal regarding the comparison, and
         a counter whose operation is controlled in accordance with the output of the comparator, the counter counting the comparison time period of the corresponding comparator, and
      wherein the counter has
         a function of switching a count mode from an up count to a down count and from a down count to an up count while a value is held, a function of performing counting at both rising and falling edges of an input clock at a frequency two times as high as that of an input clock, and a function of latching the input clock in accordance with an output signal of the comparator and setting non-inverted or inverted data of the latched data to be data of an LSB.

13. The solid-state image sensor according to claim 12, wherein the counter includes an LSB circuit that operates at the same frequency as the input clock and that sets an output of an operation thereof to be the LSB data of the counter, and a ripple counter in which bit circuits at the immediately subsequent and following stages of the LSB circuit, the bit circuits frequency-dividing an input signal, are cascade-connected.

14. The solid-state image sensor according to claim 12, wherein the counter has an output logic switching function unit for realizing a function of switching up/down while a count is held.

15. The solid-state image sensor according to claim 13, wherein the LSB circuit of the counter includes a latch circuit for latching an input clock, and a holding unit for separately storing and holding an output of the latch circuit, and wherein the LSB circuit of the counter has a function of switching non-inversion and inversion of an input clock of the next bit on the basis of the held data of the holding unit.

16. The solid-state image sensor according to claim 13, wherein the ripple counter includes a flip-flop, data from the previous stage being supplied to a clock terminal of the flip-flop, a first selector connected to the data output side of the flip-flop, and a second selector whose input is connected to the data output end of the flip-flop and whose output is connected to the data input end of the flip-flop.

17. The solid-state image sensor according to claim 16, wherein, in the ripple counter, the switching of the first selector is controlled in accordance with an up/down control signal, and the switching of the second selector is controlled in accordance with a hold signal.

18. The solid-state image sensor according to claim 17, wherein, in the ripple counter, in accordance with the control signal, the output logic of each bit is inverted, and previously up-counted data is inverted so as to be converted into complement data, thereby being switched to a down-counted result, and in order to prevent data inversion that occurs during the switching time from changing the data of the next bit, in a period in which the control signal is switched, input/output of each bit is temporarily changed from negative feedback to positive feedback, so that the data of the flip-flop is fixed.

19. The solid-state image sensor according to claim 18, wherein, in the ripple counter, the level of the control signal is switched in a state in which the data of the flip-flop is fixed, the output logic is inverted, and then, the hold signal is returned to the original, thereby returning to the original count state.

20. The solid-state image sensor according to claim 13, wherein the ripple counter includes a flip-flop, data from the previous stage being supplied to a clock terminal of the flip-flop, and a circuit that is arranged at the input stage of the clock terminal of the flip-flop and that is capable of adding both the rising and falling edges that are necessary for a counting operation in response to an external signal.

21. A camera system comprising:

a solid-state image sensor; and an optical system for forming a subject image in the image sensor, the solid-state image sensor includes pixel units in which a plurality of pixels that perform photoelectric conversion are arranged in a matrix, and a pixel signal reading unit that reads pixel signals in units of a plurality of pixels from the pixel units, wherein the pixel signal reading unit includes a plurality of A/D conversion circuits including a comparator arranged in such a manner as to correspond to column arrangement of the pixels, the comparator comparing a read signal potential with a reference voltage and outputting a determination signal regarding the comparison, and a counter whose operation is controlled in accordance with the output of the comparator, the counter counting the comparison time period of the corresponding comparator, wherein the counter has a function of switching a count mode from an up count to a down count and from a down count to an up count while a value is held, a function of performing counting at both rising and falling edges of an input clock at a frequency two times as high as that of an input clock, and a function of latching the input clock in accordance with an output signal of the comparator and setting non-inverted or inverted data of the latched data to be data of an LSB.

* * * * *